United States Patent
Liu

(10) Patent No.: US 6,528,847 B2
(45) Date of Patent: *Mar. 4, 2003

(54) METAL OXIDE SEMICONDUCTOR DEVICE HAVING CONTOURED CHANNEL REGION AND ELEVATED SOURCE AND DRAIN REGIONS

(75) Inventor: Yowjuang William Liu, San Jose, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,178

(22) Filed: Jun. 29, 1998

(65) Prior Publication Data

US 2002/0000635 A1 Jan. 3, 2002

(51) Int. Cl.[7] .......................... H01L 29/76; H01L 29/94; H01L 31/062; H01L 31/113; H01L 31/119
(52) U.S. Cl. ....................... 257/330; 257/331; 257/332; 257/333; 257/334
(58) Field of Search ................................. 257/330–334, 257/345, 283; 438/259, 268, 270, 300

(56) References Cited

U.S. PATENT DOCUMENTS

| | | | |
|---|---|---|---|
| 5,151,381 A | | 9/1992 | Liu et al. |
| 5,371,024 A | * | 12/1994 | Hieda et al. ............... 438/270 |
| 5,583,064 A | * | 12/1996 | Lee et al. .................... 257/332 |
| 5,739,063 A | | 4/1998 | Liu et al. |
| 5,808,340 A | * | 9/1998 | Wollesen et al. ........... 257/330 |

FOREIGN PATENT DOCUMENTS

| | | | | |
|---|---|---|---|---|
| JP | 53-8072 | * | 1/1978 | .................. 257/330 |
| JP | 54-117691 | * | 9/1979 | .................. 257/330 |
| JP | 6-61487 | * | 3/1994 | .................. 257/330 |

* cited by examiner

Primary Examiner—Tom Thomas
Assistant Examiner—Thien F Tran

(57) ABSTRACT

A metal oxide semiconductor (MOS) device includes a silicon substrate, source and drain regions having a predetermined junction depth ($d_j$) relative to the surface of the silicon substrate, and a gate region having a contoured channel region formed by a locally-oxidized silicon (LOCOS) structure grown to a predetermined thickness. The contoured channel region has a substantially flat surface, extending into the silicon substrate by a predetermined depth ($d_c$), and contoured edges. The depth ($d_c$) of the substantially flat surface of the contoured channel region is greater than or equal to the depth of the junction depth ($d_j$) of the source and drain regions, such that the contoured channel region is lower than or equal to the source and drain regions relative to the surface of the silicon substrate. The lower depth of the contoured channel region relative to the source and drain regions decouples shallow junction requirements from the channel length scaling. The effectively elongated channel length allows easier device optimization. The contoured edges enable formation of a channel having a non-uniform doping profile, where the contoured edges have light doped regions. The lighter-doped regions interface with the source and drain regions, resulting in a more uniform electric field density that improves the electron hole mobility for PMOS circuits, and improves the mobility of electrons for NMOS circuits. The structure also reduces junction capacitances, and gate to source and drain overlap capacitances. Consequently, a more scalable and more reliable MOSFET device can be formed.

5 Claims, 6 Drawing Sheets

METAL OXIDE SEMICONDUCTOR DEVICE HAVING CONTOURED CHANNEL REGION AND ELEVATED SOURCE AND DRAIN REGIONS

BACKGROUND OF THE INVENTION

1. Technical Field

The present invention relates to metal oxide semiconductor (MOS) devices, more specifically arrangements for forming submicron MOS devices having minimal junction depths and elevated source/drain regions.

2. Background Art

Metal oxide semiconductor devices are being manufactured at smaller sizes in order to increase density of integrated circuits on a semiconductor chip. However, additional manufacturing problems are encountered as MOS devices are scaled to smaller sizes, since a shallower source/drain junction is needed. The term "source/drain junction" herein is intended to include light doped drain (LDD) or source/drain extensions.

As junctions become shallower on the order of 0.1 microns, any further reduction in size to the channel length of the device is limited by the dimension of the polysilicon ("poly") gate and lateral diffusion. In particular, both sides of the poly gate self align with the edges of the source and drain regions, respectively. Lateral diffusion occurs under the poly gate, reducing the channel length relative to the poly gate length. Hence, the difference in length between the channel length and the poly gate depends on the lateral diffusion of the source and drain junctions.

Lateral diffusion is a function of junction depth, where lateral diffusion increases as the depth of the source and drain junctions increase. Hence, there is a desirability to minimize the lateral diffusion from the source and drain regions by scaling the junction depth when attempting to scale the polysilicon gate length.

However, reducing the junction depth in an attempt to reduce the channel length results in a higher source/drain resistance that degrades the current driving capability of the MOS device.

In addition, minimizing the depth of the source/drain junction causes additional difficulties when attempting to grow silicide at the source/drain regions. In particular, formation of silicide consumes silicon at the source/drain regions. The consumption of silicon at the source/drain regions results in a higher junction leakage that may result in spiking. The junction leakage may even short the junction and cause functional failure.

Elevated source/drain regions have been developed by growing epitaxial silicon at the source/drain regions. For example, a standard gate electrode is formed on a flat surface of a silicon substrate. Spacers are added to the gate electrode, and silicon is selectively grown over the source/drain regions to a depth of about 200–400 nm to form a stacked-source-drain (SSD) MOSFET having elevated source/drain regions. However, such SSD MOS devices still suffer from the disadvantage that lateral diffusion from the elevated source/drain regions may still affect the channel length. In addition, the epitaxial growth of silicon is not a well-controlled process. Hence, the epitaxial growth process may introduce defects. For example, the epitaxial growth process has a lateral growth problem where the grown silicon, upon reaching the level of the gate, may grow laterally and risk a short across the gate. This lateral growth becomes substantial as the MOS device is scaled to smaller dimensions. In addition, epitaxial growth suffers from the problem of corner faceting, where the interface between the epi-silicon and the sidewall of the gate is not flat, but is at an angle, resulting in defects.

SUMMARY OF THE INVENTION

There is a need for an arrangement for scaling a metal oxide semiconductor device in a manner that minimizes the reduction of source/drain junction depths and that minimizes the reduction in the channel length.

There is also a need for a MOS device that can be scaled to a reduced size without a substantial increase in the source/drain resistance.

There is also a need for an arrangement for scaling down a device without scaling down the junction depth by a corresponding amount. In other words, there is a need for an arrangement for decoupling the shallow junction requirement from channel length scaling.

These and other needs are attained by the present invention, where a MOS device has a contoured channel region that enables a scaled MOS device to have elevated source/drain regions and a substantially longer channel length, without the adverse effects of lateral diffusion.

According to one aspect of the present invention, a method of forming a metal oxide semiconductor (MOS) device comprises forming a nitride mask pattern overlying a silicon substrate, forming a locally-oxidized silicon (LOCOS) structure by oxidizing the silicon substrate at an exposed region in the nitride mask, implanting the LOCOS structure with a first impurity to form a contoured channel region having a substantially flat surface and contoured edges, and implanting portions of the silicon substrate at each end of the contoured channel region with a second impurity to form source and drain regions extending to a depth less than or equal to the substantially flat surface of the contoured channel region. The formation of the LOCOS structure and the implantation with the first impurity enables formation of a contoured channel region that extends into the substrate to a depth greater than the junctions forming the source and drain regions. The contoured channel region is not subject to the effects of lateral diffusion due to its geometry and depth relative to the source/drain regions. Hence, the requirement of a shallow junction is eliminated when scaling (i.e., reducing) the channel length.

Formation of the contoured channel region also enables a non-uniform doping profile to be established in the contoured channel region, where a higher-doped region corresponding to the substantially flat surface provides good turn-off characteristics of the MOS device. The non-uniform doping profile can also include lighter-doped regions at each of the contoured edges that interface with the respective source and drain regions. The lighter-doped regions interfacing with the source and drain regions provide better MOS device performance, for example by improving carrier mobilities and thus current driving capability, minimizing peak electrical field and hot carrier injection, improving drain induced barrier lowering (or short channel effects), and improving junction breakdown. In addition, the contoured channel region can be formed to a predetermined depth within the silicon substrate based on a length of the channel region at a predetermined power supply voltage for the MOS device. Hence, the substantially flat surface of the contoured channel can be formed below the source and drain regions to a depth based on the predetermined power supply voltage (e.g., the voltage bias).

Another aspect of the present invention provides a MOS device, comprising a silicon substrate, source and drain regions, each containing a first impurity implanted into the silicon substrate and having a predetermined junction depth relative to a surface of the silicon substrate, and a gate region. The gate region has a contoured channel region and a polysilicon gate overlying the contoured channel region. The contoured channel region has a substantially flat surface, lower than or equal to the predetermined junction depth, and contoured edges interfacing with the source and drain regions, respectively. The contoured channel region enables formation of a channel region having a non-uniform doping profile, where the substantially flat surface includes a higher doped region to optimize MOS device operating characteristics including short channel effects (SCE), whereas the contoured edges interfacing with the source and drain regions can have lighter-doped regions that provide a more uniform electric field. The more uniform electric field density improves the junction breakdown, and alleviates reverse short channel effect (RSCE), and hot carrier injection reliability problems. The lighter-doped regions also enhance the carrier mobility for better device performance. The depth of the substantially flat surfaces relative to the source and drain regions also ensures that the contoured channel region is less susceptible to lateral diffusion from the source and drain regions.

Additional objects, advantages and novel features of the invention will be set forth in part in the description which follows, and in part may become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein:

FIGS. 1A–1M are cross-sectional sequence diagrams illustrating the formation of a MOS device according to an embodiment of the present invention.

BEST MODE FOR CARRYING OUT THE INVENTION

According to the disclosed embodiment, a metal oxide semiconductor (MOS) device is formed that includes a silicon substrate, source and drain regions having a predetermined junction depth ($d_j$) relative to the surface of the silicon substrate, and a gate region having a contoured channel region. According to the disclosed embodiment, the contoured channel region has a substantially flat surface, extending into the silicon substrate by a predetermined depth ($d_c$), and contoured edges. As described in detail below, the depth ($d_c$) of the substantially flat surface of the contoured channel region is greater than, or equal to, the depth of the junction depth ($d_j$) of the source and drain regions, such that the contoured channel region is lower than the source and drain regions relative to the surface of the silicon substrate.

The lower depth of the contoured channel region relative to the source and drain regions decouples shallow junction requirements from the channel length scaling. The effectively elongated channel length allows easier device optimization. This is particularly important for PMOS devices, since their junctions are normally deeper than NMOS junctions. The gate height also is reduced significantly, and the MOS structure is much more planar for better process control. The contoured edges enable formation of a channel having a non-uniform doping profile, where the contoured edges have light doped regions. The lighter-doped regions interface with the source and drain regions, resulting in a more uniform electric field density that improves the hole mobility for PMOS circuits, and improves the mobility of electrons for NMOS circuits. The structure also reduces junction capacitances, and gate to source and drain overlap capacitances. Consequently, a more scalable and more reliable MOSFET device can be formed.

In a preferred embodiment, the contoured channel region can be easily formed by using the LOCOS process. The completed structure has a channel that is below the source/drain regions, enabling formation of a non-uniform doping profile within the channel region with a higher-doped portion in the center of the channel corresponding to the substantially flat surface, and a lighter-doped portion at each end of the higher-doped region, where the lighter-doped portion interfaces with the source and drain regions. Finally, use of the LOCOS structure enables the higher-doped region and the lighter-doped regions to be self-aligned relative to the substantially flat surface (i.e., the substantially flat center portion of the depression area) and the contoured edges, respectively. These features and the associated advantages are described in more detail with reference to the accompanying FIGS. 1–3.

Figure 1A:
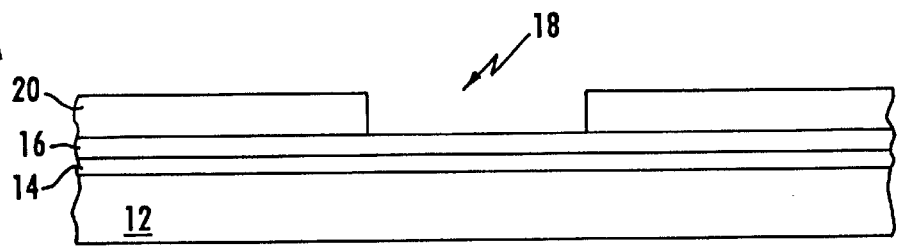

FIGS. 1A–1M are sequence diagrams summarizing the method for forming the MOS device according to an embodiment of the present invention. As shown in FIG. 1A, the method begins by forming a nitride gate mask pattern 10 overlying a silicon substrate 12. Specifically, the method begins by using a P-type substrate or an N-type substrate 12. Formation of a NMOS device will be illustrated.

Figure 1B:
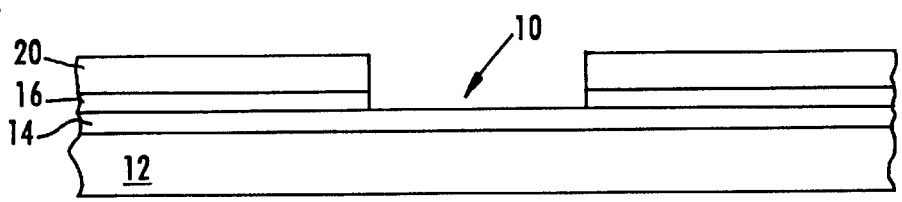

Prior art techniques would define the isolation regions first. According to the disclosed embodiment, however, the gate mask 18 is first defined in order to establish the gate and the corresponding contoured channel region. For example, a barrier oxide layer 14 is formed on the silicon substrate 12 by growing an oxide layer to a thickness of about 50–250 Å. After the barrier oxide layer 14 is formed on the silicon substrate 12, a nitride layer 16 is deposited on the barrier oxide layer 14. A resist layer 20 is then formed on the nitride film 16 and patterned to form the gate mask 18, as shown in FIG. 1A. The nitride film 16 is then etched from the exposed regions of the gate mask 18 to expose at least the barrier oxide layer 14 to form the nitride gate mask pattern 10, as shown in FIG. 1B. If desired, the barrier oxide layer 14 exposed by the gate mask 18 may also be etched to expose the silicon substrate 12. The resist layer 20 is then stripped.

Figure 1C:
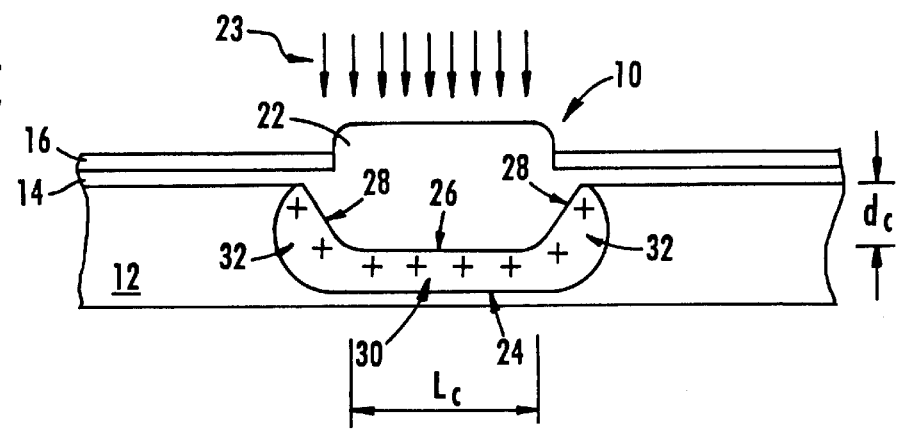

Following formation of the nitride mask pattern 10, a locally-oxidized silicon (LOCOS) structure 22 is then formed as shown in FIG. 1C by field oxidizing the silicon substrate 12 at the exposed region of the nitride mask 10. According to the disclosed embodiment, the LOCOS structure 22 is formed in a manner based on U.S. Pat. No. 5,151,381 ('381 Patent) that minimizes the penetration of oxide under the nitride mask region 10, resulting in the formation of a "bird beak" having a minimal size, where the ratio of the length of the bird beak $L_{BB}$ (i.e., the length of the nitride extending from the substantially flat nitride layer) to the total LOCOS thickness $T_{fox}$ is minimized. In particular, barrier oxide layer 14 has a thickness $T_{pd}$ and nitride layer 16 has a thickness $T_{nit}$. The barrier oxide 14 thickness $T_{pd}$ may range from 50 to 250 Å and the nitride 16 thickness $T_{nit}$ may range from 1,000 to 3,000 Å. In one embodiment $T_{pd}$ is approximately 150 Å and $T_{nit}$ it is approximately 2,000 Å. Thus, the ratio $T_{nit}/T_{pd}$ is approximately 13.

Field oxide region 22 is formed by oxidizing substrate 12 in an environment including dry oxygen and HCl at a temperature ranging from 1,000° C. to 1,250° C. The dry oxidation may be a multi-step oxidation process, in which a first oxidation step is performed at a temperature of approximately 1,000° C. in an atmosphere comprising approximately 0.1–10% HCl and 90–99.9% $O_2$ for a period of approximately 30 to 120 minutes. This first oxidation step forms a thin oxide layer over nitride 16 to protect the nitride from reacting with HCl during the later oxidation steps. The reaction of nitride 16 with HCl is dependent on temperature and does not occur below approximately 1,050° C. The purpose of adding HCl to the oxidizing atmosphere for the first oxidation step is to clean the surface to be oxidized by removing, for example, metallic contamination.

A second oxidation step is performed at a temperature of approximately 1,125° C. in an atmosphere comprising approximately 0.1–10% HCl and 90–99.9% $O_2$ for a period of approximately 4 to 10 hours. The oxidation time may be 6.5 hours and field oxide regions 22 may have a thickness $T_{fox}$ of approximately 4,500 Å. As in the first oxidation step the concentrations of HCl and $O_2$ in the oxidizing environment may be optimized by those of ordinary skill in the art. HCl is added to the oxidizing environment in the second oxidation step to prevent stacking faults. It is believed that $O_2$ is injected into the crystalline lattice of silicon substrate 12, and that this interstitial $O_2$ causes mismatches in the lattice which lead to stacking faults. The HCl neutralizes the interstitial $O_2$, thereby preventing stacking faults.

Both oxidation steps include a stabilization period in an inert or oxidizing atmosphere. In the multi-step oxidation, the atmosphere for the stabilization period of the first oxidation step comprises 10–40% $O_2$ and 60–90% Argon and the atmosphere for the stabilization period of the second oxidation step comprises approximately 100% Argon. Those of ordinary skill in the art will be able to optimize the atmosphere during the stabilization period.

An improved process for forming LOCOS structures, disclosed in commonly-assigned, U.S. Pat. No. 5,739,063, provides a method for forming field oxide regions which enables the formation of very narrow source/drain regions. In summary, it was discovered that the application of the method disclosed in U.S. Pat. No. 5,151,381 to fine line patterns, particularly narrow source/drain regions, results in the generation of defects at the tips of such source/drain regions. It was found that the high temperature LOCOS technique of the '381 Patent, when applied to very fine geometries, particularly narrow source/drain regions, causes a reduction in the adhesion of the barrier oxide layer to the semiconductor substrate. As a result, upon application of a hot phosphoric acid etch to remove the nitride layer, the underlying semiconductor substrate is damaged at the terminal portions of the barrier oxide, thereby damaging the end portions of the source/drain regions. This damage is characterized as "tip defects."

Thus, as a result of extensive experimentation and investigation, a tip defect problem was discovered upon applying the high temperature LOCOS technique of the '381 Patent to fine geometries requiring very narrow source/drain regions, and the source of the tip defect problems traced to the stresses generated during LOCOS and the presence of chlorine at the interface of the barrier oxide layer and the semiconductor substrate. This problem is solved by controlling the amount of HCl employed during formation of a field oxide region so that the peak concentration of chlorine at the interface between the barrier oxide layer is sufficient to reduce or eliminate stacking faults, but limited to avoid adversely affecting the operation of a semiconductor device with fine line geometry, as by tip defects. Thus, the amount of HCl during formation of the field oxide region is controlled to limit the peak concentration of chlorine at the interface of the barrier oxide layer to the semiconductor substrate to avoid reduction of the adhesion of the barrier oxide layer to the semiconductor substrate.

The tip defects can be inspected by conventional analytical tools, such as Secondary Electron Microscopy (SEM) and Transmission Electron Microscopy (TEM). The amount of chlorine at the interface between the barrier oxide layer and the semiconductor substrate can be monitored by conventional analytical tools, such as Secondary Ion Microscopy (SIMS). These analytical tools enable detection of the tip defects and the concentration profile of chlorine atoms at the interface between the barrier oxide layer and the semiconductor substrate. In this way, the amount of chlorine at the interface between the barrier oxide layer and the semiconductor substrate can be correlated to the tip defects. In addition, quality of the gate oxide layer can be monitored by conventional QBD measurements to determine the time to breakdown employing conventional apparatus, such as an HP4145 available from Hewlett Packard. In this way, the amount of chlorine at the interface between the barrier oxide layer and the semiconductor substrate can be correlated to the quality of the gate oxide and, thereby, the amount of HCl can be related to the breakdown of the gate oxide layer. The amount of HCl employed to achieve the desired objectives is inversely proportionate to the temperature that which the HCl is introduced. Thus. as the temperature of the stage in which HCl is employed increases, the amount of HCl in the atmosphere decreases. One having ordinary skill in the art optimizes the relative amount of HCl and temperature for a particular situation. The gate oxide layer is not part of the original barrier oxide layer on which the nitride layer is formed.

As shown in FIG. 1C, formation of the LOCOS structure 22 involves consumption of the silicon substrate 12. Hence, formation of the LOCOS structure 22 to an overall maximum thickness of 5,000 Å results in the extension of the LOCOS structure below the surface of the substrate 12 by a depth $d_c$ of approximately 2,500 Å. The depth of the LOCOS structure 22 is predetermined based on the length ($L_c$) of the channel region 24, and the predetermined power supply voltage (e.g., bias) for the MOS device affecting the depth ($d_j$) of the source and drain junctions. Hence, the thickness of the LOCOS structure 22 is optimized for a predetermined power supply voltage. Use of the LOCOS structure 22 is particularly advantageous, since the depth $d_c$ of the LOCOS structure 22 into the substrate 12 is independent of the dimension of the gate.

Once the LOCOS oxide structure 22 is formed as described above to a total thickness of 1,000–5,000 Å having a corresponding depth $d_c$ of 500–2,500 Å based on the channel length $L_c$ and the voltage bias, the nitride mask 10 is used as an implant mask for implanting the LOCOS structure 22 with a p-type impurity 23 as a channel implant to form a contoured channel region 24 having a substantially flat surface 26, corresponding to the substantially flat center portion of the depression area formed by the LOCOS structure 22, and contoured edges 28. This contoured channel structure may also be formed by other LOCOS processes. The channel implant is performed, for example, using an implant energy of approximately 150 keV. Note that the implant does not need to be performed in a single step, rather multiple implants can be performed to dope the channel region 24.

As shown in FIG. 1C, implantation through the LOCOS structure into the silicon substrate 12 causes formation of a contoured channel region 24 having a non-uniform doping profile. Specifically, a higher-doped region 30 having an impurity concentration of about $10^{17}$ to $10^{19}$ atoms/cm$^3$ is formed along the substantially flat surface 26, which is substantially perpendicular to the incidence angle for the implanted impurities. The contoured edges 28, however, cause formation of lighter-doped regions 32, having an impurity concentration of about $10^{15}$ to $10^{17}$ atoms/cm3 at each end of the higher-doped region 30. Hence, implanting the LOCOS structure 22 with a p-type impurity forms the contoured channel region 24, where the substantially flat surface 26 corresponds to the higher-doped region 30, and the contoured edges 28 correspond to lighter-doped regions 32, respectively. Hence, the contoured channel region 24 is self-aligned relative to the LOCOS structure, such that the lighter-doped regions 32 are self-aligned relative to the contoured edges 28.

Figure 1D:
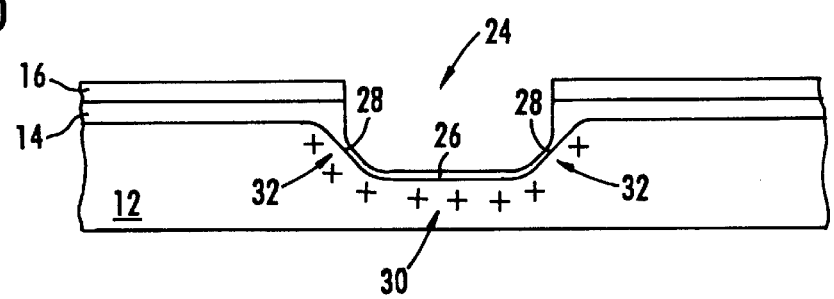

The regions of the LOCOS oxide layer exposed within the implant mask 10 are then etched, exposing the contoured channel surfaces 24 as shown in FIG. 1D.

Figure 1E:
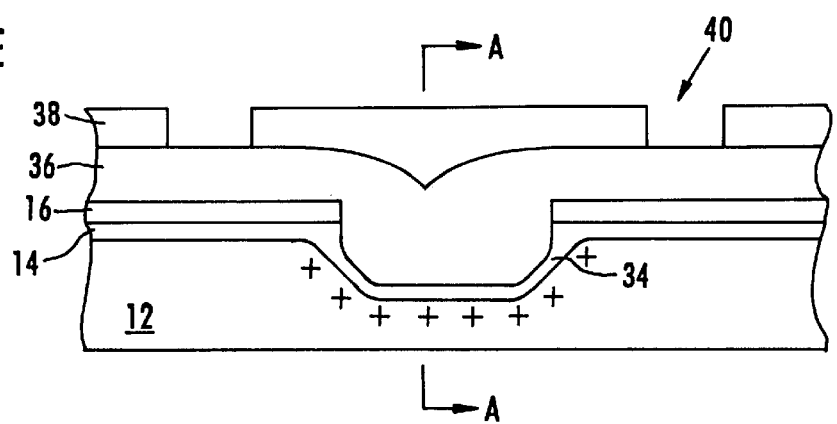
Figure 4A:
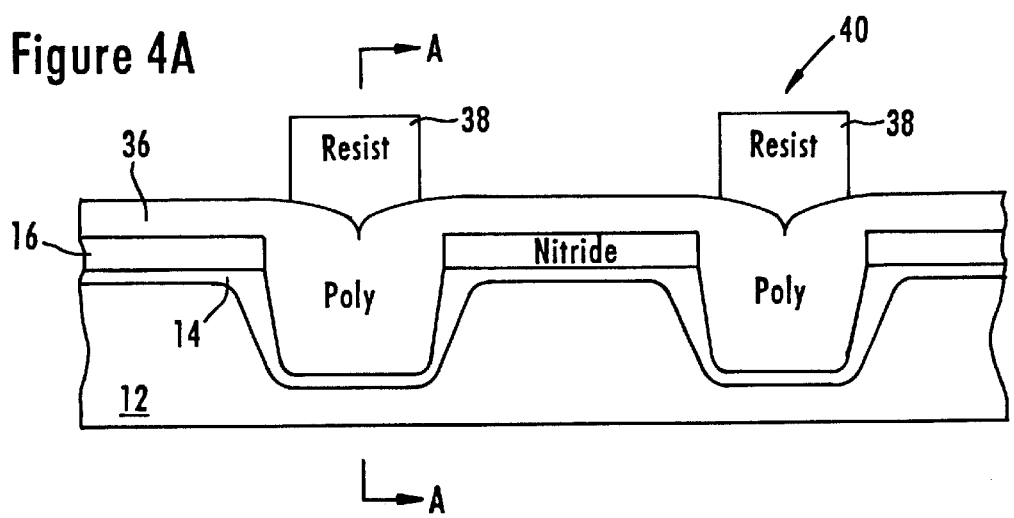
FIGS. 4A–4E are cross section views of FIGS. 1E, 1F, 1G. 1H, and 1J along lines A, B, C, and D, respectively.

Following formation of the contoured channel region having the higher-doped region 30 and the lighter-doped region 32, a thin layer of gate oxide 34 is grown on the exposed contoured channel region 24, as shown in FIG. 1E. A layer of polysilicon 36 is then deposited overlying the contoured channel region by depositing the polysilicon layer 36 on the nitride layer 16 and the gate oxide layer 34. A photoresist layer 38 is then deposited and patterned to form a trench isolation mask 40, as shown in FIG. 1E and FIG. 4A. FIG. 4A is a cross-section of FIG. 1E along line A—A.

Figure 1F:
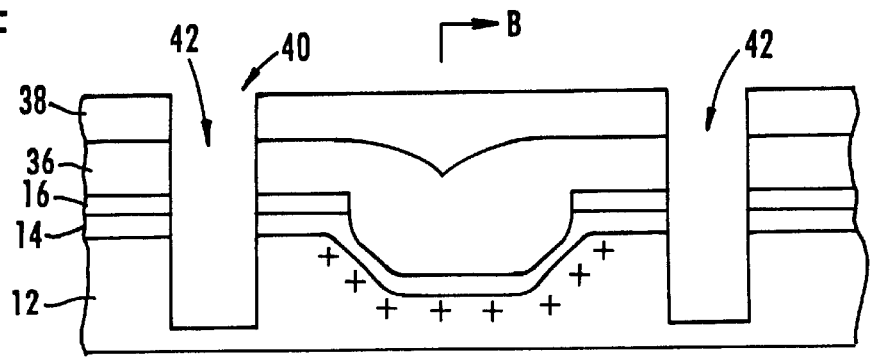
Figure 1G:
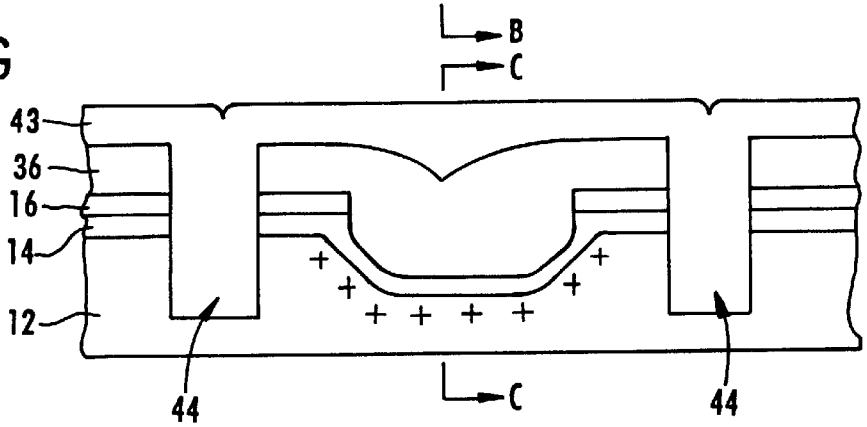
Figure 4B:
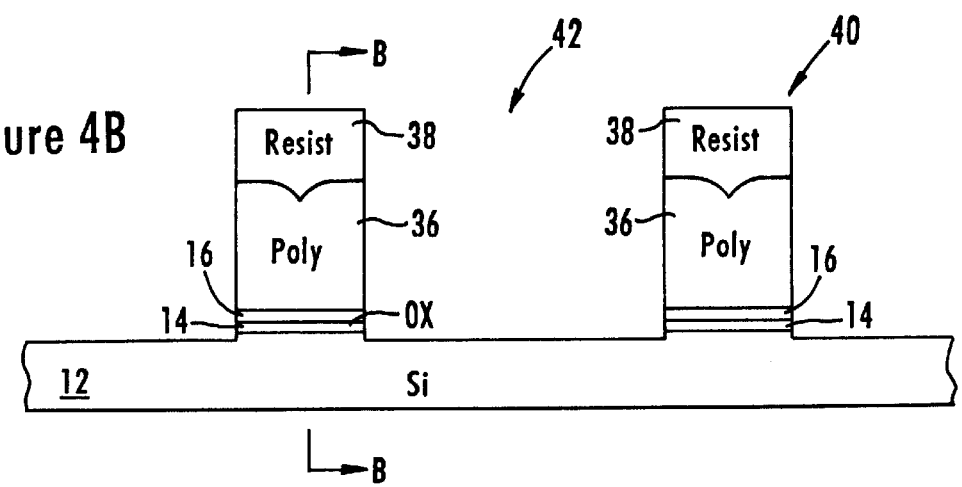
Figure 4C:
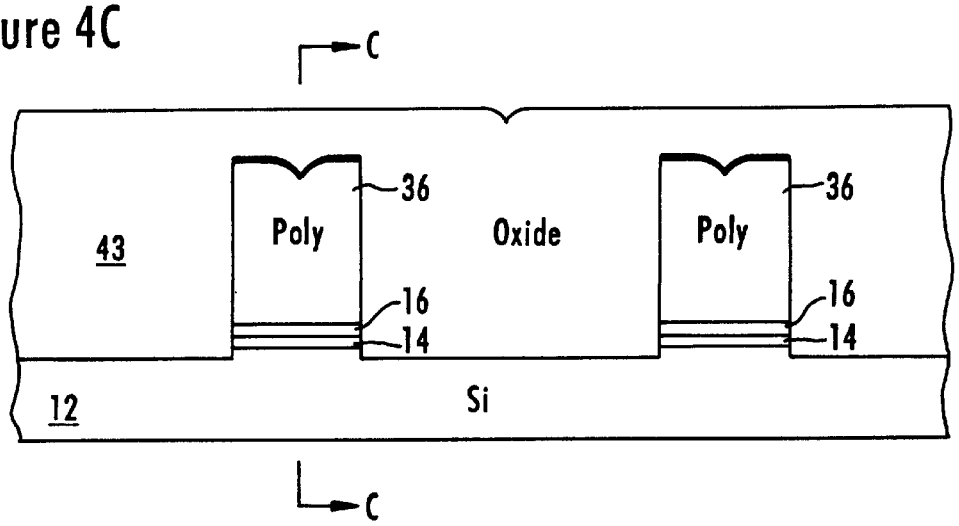

A trench etch is then performed to form a trench 42 at each end of the MOS device, shown in FIG. 1F and FIG. 4B. As shown in FIG. 1F, the trench 42 extends through the polysilicon layer 36, the nitride layer 16, the oxide layer 14 and the silicon substrate 12 to isolate the MOS device. The trench 42 is then oxidized and filled by depositing an oxide layer 43, for example TEOS, to form trench isolation structures 44 as shown in FIG. 1G and FIG. 4C. Hence, the MOS device can be implemented in a high density integrated circuit.

Figure 2:
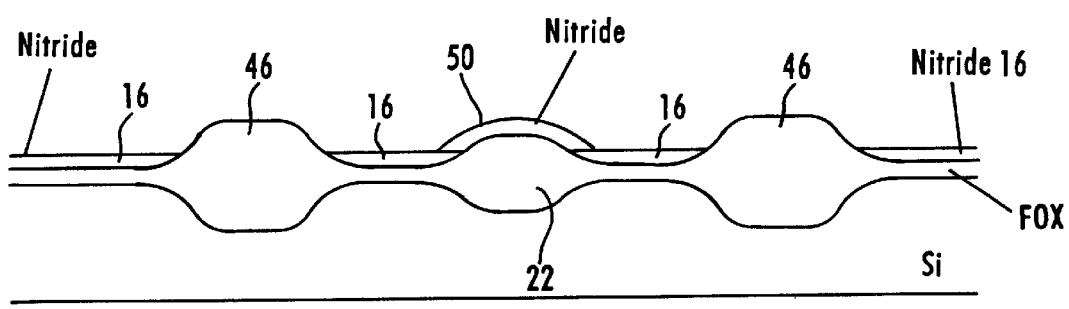
FIG. 2 is a cross-sectional diagram illustrating alternative formation of isolation regions using LOCOS structures.

The MOS device may alternatively be isolated using other isolation techniques, such as LOCOS, as illustrated in FIG. 2. Specifically, FIG. 2 is a diagram illustrating formation of LOCOS isolation structures 46 following formation of the LOCOS structure 22 in FIG. 1C. Specifically, the LOCOS isolation structures 46 can be formed at the same time as the LOCOS structure 22. Alternatively, the isolation structures 46 can be formed following formation of the LOCOS structure 22 by depositing a nitride layer 50 on the gate LOCOS structure 22. The nitride layer 50 protects the LOCOS structure 22 during subsequent formation of the isolation LOCOS structures 46, enabling the isolation LOCOS structures to have a larger size than the gate LOCOS structure 22.

Figure 4D:
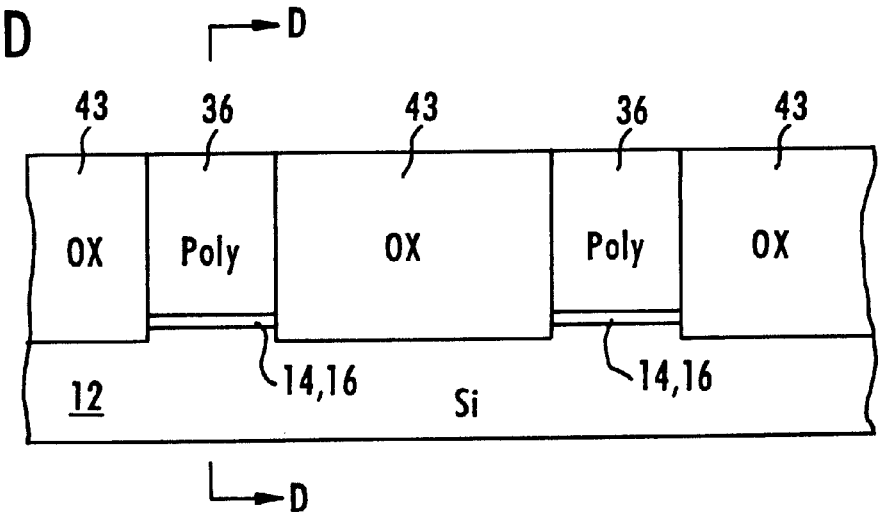

Following the formation of the trench isolation structures 44 as shown in FIG. 1G, the nitride layer 16 is exposed by chemical and mechanical polishing (CMP) back the deposited oxide layer 43 to the nitride layer 16, used as a stop layer for the CMP. The polishing back using CMP back to the nitride layer 16 results in the structure of FIG. 1H and FIG. 4D.

Figure 1H:
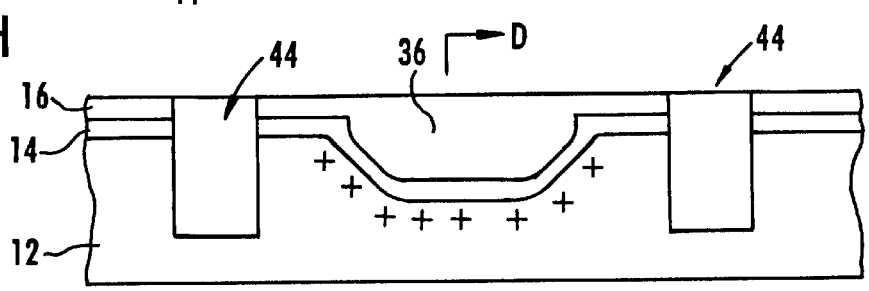
Figure 1I:
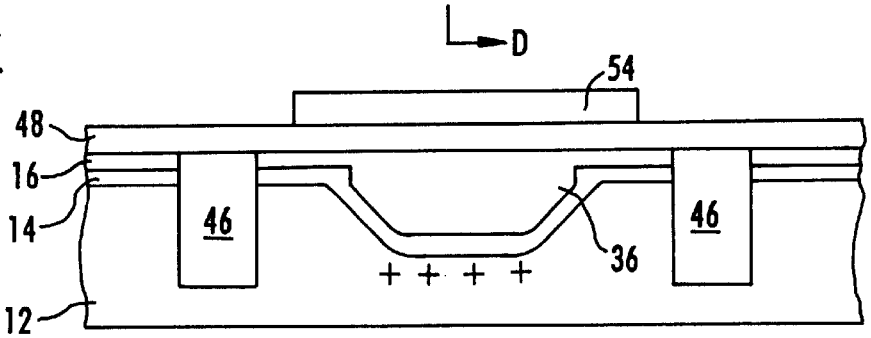
Figure 3:
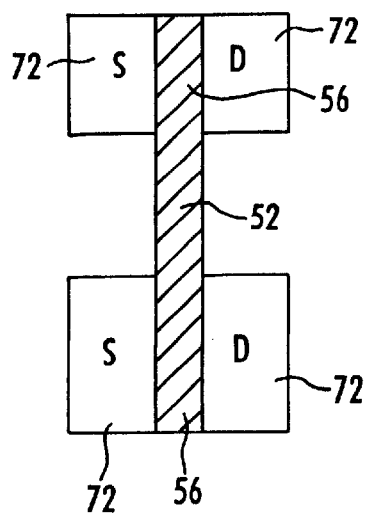
FIG. 3 is a layout diagram of the MOS device formed according to the method of FIGS. 1A–1M.
Figure 4E:
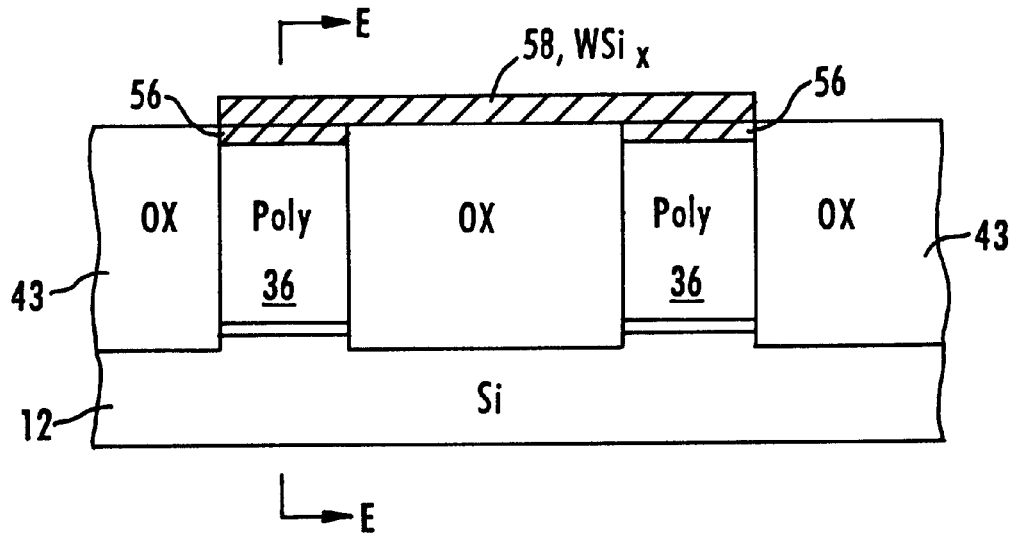

As shown in FIG. 1H, use of the nitride layer 16 as the stop layer for the CMP also exposes the polysilicon gate 36. A layer of refractory metal silicide 48, for example tungsten, is then deposited on the exposed nitride layer 16, polysilicon gate 36, and the isolation structures 46. A photoresist mask (not shown) is then patterned on the deposited tungsten layer 48 to define interconnect segments 52, as shown in FIG. 3. A silicon implant 54 is performed to dope the exposed tungsten film. After the silicon implant, the mask is stripped, as shown in FIG. 1I, and a silicide rapid thermal annealing (RTA) is performed (e.g., 800–1000° C. between 40–60 seconds), causing the tungsten layer 48 to react with the exposed polysilicon 36 and the implanted area silicon 54 deposited by the mask to form polycide regions 56 and silicide regions 58, respectively. The unsilicided tungsten is then stripped using, for example, a chemical wet etch to remove free, unbonded tungsten, resulting in the structure of FIG. 1J and FIG. 4E.

Figure 1J:
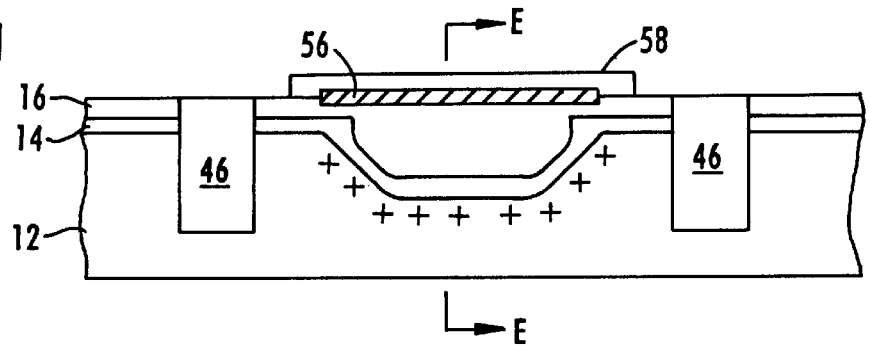

Following formation of the structure of FIG. 1J, the nitride layer 16 and the oxide layer 14 are selectively etched to expose regions of the silicon substrate 12 to be implanted to form active regions, for example the source and drain regions. An optional low-dose drain (LDD) or source/drain extension can be performed to make the NMOS and any PMOS transistors less susceptible to hot electronic effects. However, no LDD implant is needed, due to the differential oxide thickness at the gate edge, where a self-aligned light-doped junction profile is formed along the gate edge. Spacers 60 are also formed to electrically isolate the edges of the polysilicon gate 36. For example, the spacers 60 are formed by depositing 100–2000 Å of oxide, and selectively etching back the deposited oxide to form the insulating spacers on the edge of the polysilicon as shown in FIG. 1K.

Figure 1K:
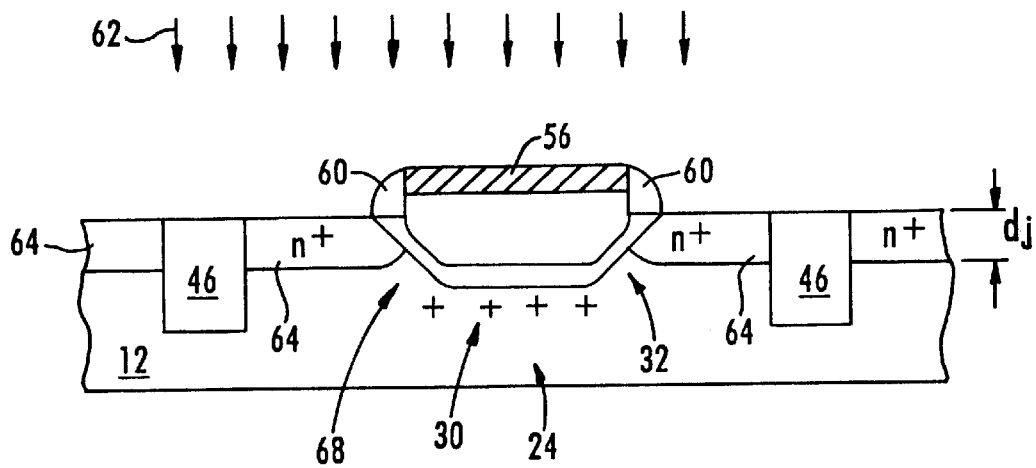

After the spacers 60 have been formed, the selectively exposed regions of the substrate 12 are implanted with n+ impurities 62 into the substrate 12, to form the source and drain regions 64 for the MOS device as shown in FIG. 1K. As shown in FIG. 1K, the source and drain junctions 64 and the spacers 60 minimize the lateral diffusion of the polysilicon gate 36. In particular, the contoured edges 28 cause the junction boundaries 68 to be substantially flat, compared with prior art doping techniques that create curved edges in the doped source drain regions. Hence, the contoured edges 28 cause the formation of substantially flat junction boundaries 68 for the source and drain regions that interface with the respective contoured edges 28. The impurity implant continues for a predetermined time until the junction depth reaches a predetermined depth $d_j$ assuming the junction is properly biased with a predetermined voltage source. Hence, as shown in FIG. 1K, the contoured channel region is lower than the substantially flat junction boundaries 68 of the source and drain regions 64.

Figure 1M:
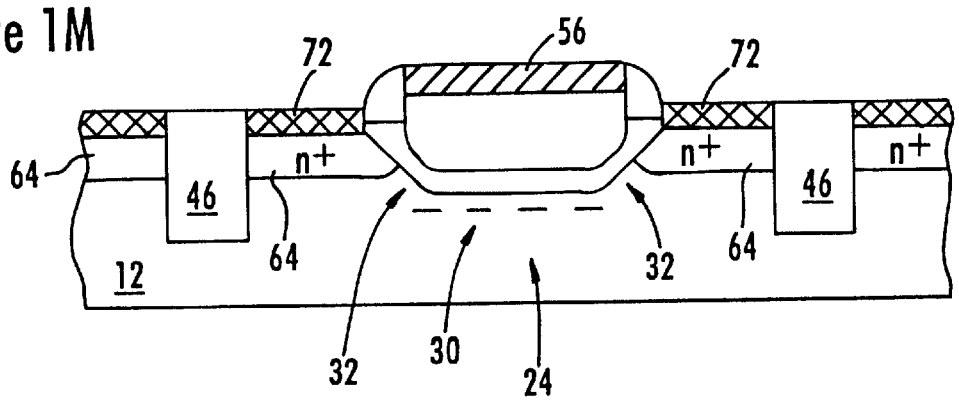

A refractory metal silicide, such as tungsten or titanium, is deposited to form the self-aligned silicide regions 72 (salicide) as shown in FIG. 1M. As shown in FIG. 1M, the elevated source/drain regions 64 enable a greater amount of silicon to be consumed in the formation of the salicide 72, in order to reduce the sheet resistance of the source and drain regions. The MOS device of FIG. 1M may be manufactured using the disclosed process, for example to have a channel length ($L_c$) of less than 0.25 microns and a junction depth ($d_j$) of less than 0.1 microns, while maintaining good electrical performance and long term reliability.

According to the disclosed embodiment, a LOCOS structure is used to define a channel region below a source and drain region, where the channel region includes contours at each end that interface with the source and drain boundaries. The contours of the channel region enable formation of a channel region with a non-uniform doping profile, with a higher-doped portion at a substantially flat portion of the channel region, and lighter-doped portions at the source/drain region interfaces. The use of the LOCOS structure to define the channel region enables the higher-doped regions and the lighter-doped regions to be self-aligned within the channel, further improving reliability and scalability in submicron MOS devices.

Although the disclosed embodiment has been described with respect to submicron MOS devices, the disclosed embodiment may also be used for larger devices to improve the device performance, for example to reduce the sheet resistance of the source and drain regions by using thicker silicide films. Hence, the formed contoured channel region provides numerous advantages in the completed MOS device, at least a few of which have been described above, that improves the performance and long-term reliability of the MOS device.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A metal oxide semiconductor (MOS) device comprising:

a silicon substrate;

source and drain regions in said substrate, each containing a first impurity implanted into the silicon substrate and having a predetermined junction depth relative to an upper surface of the silicon substrate;

a contoured channel region comprising a lower, substantially horizontal portion and a pair of curved portions extending at a slope to said upper surface of said substrate from respective ends of said lower, substantially horizontal portion, the lower substantially horizontal portion of the channel being lower than the predetermined junction depth of said source and drain regions, the curved portions abutting the source and drain regions, said lower, substantially horizontal portion and each of said pair of curved portions of said contoured channel region having a second impurity implanted therein to form a non-uniform doping profile in said channel region with a heavier-doped region under the lower, substantially horizontal portion and lighter-doped regions under the curved portions; and a gate insulator layer covering the horizontal portion and curved portions of the contoured channel region.

2. The MOS device of claim 1, wherein the heavier doped region and the lighter-doped regions are self-aligned relative to the contoured channel region.

3. The MOS device of claim 2, further comprising:

first and second self-aligned silicide films having a predetermined thickness and formed on surfaces of the source and drain regions, respectively; and a polysilicon gate overlying said contoured channel region.

4. The MOS device of claim 3, wherein the contoured channel region has a channel length of less than 0.25 micron and the predetermined junction depth is less than 0.1 micron.

5. The MOS device of claim 1, wherein the contoured channel region includes a substantially flat surface corresponding to the heavier doped region, and curved portions corresponding to the lighter-doped regions and interfacing with the source and drain regions, respectively.

* * * * *